(12) United States Patent
King (10) Patent No.: US 7,005,711 B2
(45) Date of Patent: Feb. 28, 2006

(54) N-CHANNEL PULL-UP ELEMENT AND LOGIC CIRCUIT

(75) Inventor: Tsu-Jae King, Fremont, CA (US)

(73) Assignee: Progressant Technologies, Inc., Mountain View, CA (US)

( * ) Notice: Subject to any disclaimer, the term of this patent is extended or adjusted under 35 U.S.C. 154(b) by 0 days.

(21) Appl. No.: 10/324,485

(22) Filed: Dec. 20, 2002

(65) Prior Publication Data

US 2004/0119114 A1    Jun. 24, 2004

(51) Int. Cl.
  H01L 29/94    (2006.01)
(52) U.S. Cl. ..................................... 257/368
(58) Field of Classification Search ............... 257/369, 257/368, 296, 310, 327, 344
  See application file for complete search history.

(56) References Cited

U.S. PATENT DOCUMENTS

| | | | |
|---|---|---|---|
| 3,903,542 A | 9/1975 | Nathanson et al. | |
| 3,974,486 A | 8/1976 | Curtis et al. | |
| 4,142,176 A * | 2/1979 | Dozier | 326/44 |
| 4,644,386 A | 2/1987 | Nishizawa et al. | |
| 5,023,836 A | 6/1991 | Mori | |
| 5,084,743 A | 1/1992 | Mishra et al. | |
| 5,442,194 A | 8/1995 | Moise | |
| 5,448,513 A | 9/1995 | Hu et al. | |
| 5,455,432 A | 10/1995 | Hartsell et al. | |
| 5,463,234 A | 10/1995 | Toriumi et al. | |
| 5,523,603 A | 6/1996 | Fishbein et al. | |
| 5,552,622 A | 9/1996 | Kimura | |
| 5,654,573 A * | 8/1997 | Oashi et al. | 257/349 |
| 5,732,014 A | 3/1998 | Forbes | |
| 5,761,114 A | 6/1998 | Bertin et al. | |
| 5,798,965 A | 8/1998 | Jun | |
| 5,843,812 A | 12/1998 | Hwang | |
| 5,945,706 A | 8/1999 | Jun | |
| 5,959,328 A | 9/1999 | Krautschneider et al. | |
| 6,015,739 A | 1/2000 | Gardner et al. | |
| 6,075,265 A | 6/2000 | Goebel et al. | |
| 6,084,796 A | 7/2000 | Kozicki et al. | |
| 6,097,036 A | 8/2000 | Teshima et al. | |
| 6,128,216 A | 10/2000 | Noble, Jr. et al. | |
| 6,130,559 A | 10/2000 | Balsara et al. | |
| 6,150,242 A | 11/2000 | Van der Wagt et al. | |
| 6,184,539 B1 | 2/2001 | Wu et al. | |
| 6,205,054 B1 | 3/2001 | Inami | |
| 6,222,766 B1 | 4/2001 | Sasaki et al. | |

(Continued)

FOREIGN PATENT DOCUMENTS

EP    0747940 A2    12/1996

(Continued)

OTHER PUBLICATIONS

Barlow, P. S. et al., "Negative differential output conductance of self-heated power MOSFETs," IEE Proceedings-I Solid-State and Electron Devices, vol. 133, Part 1, No. 5, Oct. 1986, pp. 177-179.

(Continued)

Primary Examiner—Douglas W. Owens
(74) Attorney, Agent, or Firm—Bever, Hoffman & Harms, LLP; Jeanette S. Harms (57) ABSTRACT

An n-channel field effect transistor (FET) includes a switchable negative differential resistance (SNDR) characteristic. The n-channel SNDR FET is configured as a depletion mode device, and biased so that it operates essentially as a p-channel device. The device is suitable as a replacement for a p-channel pull-up devices in logic gates (including in inverters) and memory cells.

30 Claims, 6 Drawing Sheets

| $V_{IN}$ | NMOS state | SNDR-FET state | | $V_{OUT}$ |
|---|---|---|---|---|
| GND | OFF | ON | Non-NDR | $V_{DD}$ |
| $V_{DD}$ | ON | OFF | NDR | GND |

U.S. PATENT DOCUMENTS

| | | | |
|---|---|---|---|
| 6,225,165 B1 | 5/2001 | Noble, Jr. et al. | |
| 6,261,896 B1 | 7/2001 | Jun | |
| 6,310,799 B1 * | 10/2001 | Duane et al. | 365/159 |
| 6,353,251 B1 | 3/2002 | Kimura | |
| 6,396,731 B1 | 5/2002 | Chou | |
| 6,404,018 B1 | 6/2002 | Wu et al. | |
| 6,424,174 B1 | 7/2002 | Nowak et al. | |
| 6,479,862 B1 * | 11/2002 | King et al. | 257/321 |
| 6,594,193 B1 * | 7/2003 | King | 365/226 |
| 6,596,617 B1 * | 7/2003 | King et al. | 438/606 |
| 6,664,601 B1 * | 12/2003 | King | 257/369 |
| 2001/0013621 A1 | 8/2001 | Nakazato | |
| 2001/0024841 A1 | 9/2001 | Noble, Jr. et al. | |
| 2001/0053568 A1 | 12/2001 | Deboy et al. | |
| 2002/0017681 A1 | 2/2002 | Inoue et al. | |
| 2002/0048190 A1 | 4/2002 | King | |
| 2002/0054502 A1 | 5/2002 | King | |
| 2002/0057123 A1 | 5/2002 | King | |
| 2002/0063277 A1 | 5/2002 | Ramsbey et al. | |
| 2002/0066933 A1 | 6/2002 | King | |
| 2002/0067651 A1 | 6/2002 | King | |
| 2002/0076850 A1 | 6/2002 | Sadd et al. | |
| 2002/0093030 A1 | 7/2002 | Hsu et al. | |
| 2002/0096723 A1 | 7/2002 | Awaka | |
| 2002/0100918 A1 | 8/2002 | Hsu et al. | |
| 2002/0109150 A1 | 8/2002 | Kajiyama | |

FOREIGN PATENT DOCUMENTS

| | | |
|---|---|---|
| EP | 0747961 A2 | 12/1996 |
| EP | 0655788 B1 | 1/1998 |
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1168456 A2 | 1/2002 |
| EP | 1204146 A1 | 5/2002 |
| JP | 8018033 A2 | 1/1996 |
| JP | 2001 01015757 A2 | 1/2001 |
| WO | WO 90/03646 A1 | 4/1990 |
| WO | WO 99/63598 A1 | 4/1999 |
| WO | WO 00/41309 A1 | 7/2000 |
| WO | WO 01/65597 A1 | 9/2001 |
| WO | WO 01/69607 A2 | 9/2001 |
| WO | WO 01/88977 A2 | 11/2001 |
| WO | WO 01/99153 A2 | 12/2001 |

OTHER PUBLICATIONS

Neel, O. L, et al., "Electrical Translent Study of Negative Resistance in SOI MOS Transistors," Electronics Letters, vol. 26, No. 1, pp. 73-74, Jan. 1990.

Mohan, S. et al., "Ultrafast Pipelined Adders Using Resonant Tunneling Transistors," IEE Electronics Letters, vol. 27, No. 10, May 1991, pp. 830-831.

Zhang, J.F. et al., "Electron trap generation in thermally grown SIO2 under Fowler-Nordhelm stress," J. Appl. Phys. 71 (2), Jan. 15, 1992, pp. 725-734.

Zhang, J.F. et al., "A quantitative Investigation of electron detrapping in SIO2 under Fowler-Northhelm stress," J. Appl. Phys. 71 (12), Jun. 15, 1992, pp. 5989-5996.

Zhang, J.F. et al., "A comparative study of the electron trapping and thermal detrapping in SIO2 prepared by plasma and thermal oxidation," J. Appl. Phys. 72 (4), Aug. 15, 1992, pp. 1429-1435.

Luryi, S. et al., "Collector-Controlled States in Charge Injection Transistors," SPIE-92 Symposium, pp. 1-12, 1992.

Luryi, S. et al., "Collector-Controlled States and the Formation of Hot Electron Domains in Real-Space Transfer Transistors," AT&T Bell Laboratories, pp. 1-7, 1992.

Luryi, S. et al., "Light-emitting Logic Devices based on Real Space Transfer in Complementary inGaAs/InAIAs Heterostructures", In "Negative Differential Resistance and Instabilities in 2D Semiconductors", ed. by N. Balkan, B.K. Ridley, and A. J. Vickers, NATO ASI series [Physics] B 307, pp. 63-82, Plenum Press (New York 1993).

Mohan, S, et al., "Logic Design Based on Negative Differential Resistance Characteristics of Quantum Electronic Devices," IEE Proceedings-G: Electronic Devices, vol. 140, No. 6, Dec. 1993, pp. 383-391.

Mohan, S. et al., "Ultrafast Pipelined Arithmetic Using Quantum Electronic Devices," IEE Proceedings-E: Computers and Digital Techniques, vol. 141, No. 2, Mar. 1994, pp. 104-110.

Chan, E. et al., "Compact Multiple-Valued Multiplexers Using Negative Differential Resistance Devices," IEEE Journal of Solid-State Circuits, vol. 31, No. 8, Aug. 1996, pp. 1151-1156.

Chan, E. et al., "Mask Programmable Multi-Valued Logic Gate Using Resonant Tunnelling Diodes," IEE Proceedings-Circuits Devices Syst., vol. 143, No. 5, Oct. 1996, pp. 289-294.

Shao, Z. et al., "Transmission Zero Engineering in Lateral Double-Barrier Resonant Tunneling Devices," Dept. of Electrical Engineering, University of Notre Dame, pp. 1-7 (1996).

Goldhaber-Gordon, David et al., "Overview of nanoelectronic devices," Proc. IEEE, 85(4), Apr. 1997, pp. 521-540.

Koester, S. J. et al., "Negative Differential Conductance in Lateral Double-Barrier Transistors Fabricated in Strained Si Quantum Wells," Applied Physics Letters, vol. 70, No. 18, May, 1997, pp. 2422-2424.

Dozsa, L. et al., "A transient method for measuring current-voltage characteristics with negative differential resistance regions," Research Institute for Technical Physics, P.O. Box 76, H-1325 Budapest, Hungary, (Received Jul. 24, 1997; accepted Aug. 1, 1997), 2 pages.

Pacha, C. et al., "Design of Arithmetic Circuits using Rsonant Tunneling Diodes and Threshold Logic," Lehrstuhl Bauelemente der Elektrotechnik, Universitat Dortmund, pp. 1-11, Sep. 1997.

Hansch, W. et al., "The planar-doped-barrier-FET: MOSFET overcomes conventional limitations," ESSDERC'97 27TH European Solid-State Device Research Conference, Stuttgart, Sep. 22-24, 1997, 4 pages.

Wirth, G. et al., "Periodic transconductance oscillations in sub-100nm MOSFETs," ESSDERC'97 27th European Solid-State Device Research Conference, Stuttgart, Sep. 22-24, 1997, 4 pages.

Haddad, G.I. et al., "Tunneling Devices and Applications in High Functionality/Speed Digital Circuits," Solid State Electronics, vol. 41, No. 10, Oct. 1997, pp. 1515-1524.

Gardner, C. et al., "Smooth Quantum Hydrodynamic Model Simulation of the Resonant Tunneling Diode," Dept. of Mathematics Arizona State University, pp. 1-5, (1998).

Jungel, A. et al., "Numerical Simulation of Semiconductor Devices: Energy-Transport and Quantum Hydrodynamic Modeling," Fachberelch Math., Tech. Univ. Berlin, Germany, pp. 1-9, 1998.

Nimour, S. M. A. et al., "Effect of Spatially Disordered Barriers on the Band Structure of Finite Superlattices," phys. stat. sol. (b) 1998, 209, No. 2, 311-318.

Rommel, S. L. et al., "Room Temperature Operation of Epitazially Grown SI/SI0.5GE0.5/SI Resonant Interband Tunneling Diodes," Applied Physics Letters, vol. 73, No. 15, pp. 2191-2193, 1998.

Van Der Wagt, J. P. A. et al., "RTD/HFET Low Standby Power SRAM Gain Cell," Source: Corporate Research Laboratories, Texas Instruments, 1998, 4 pages.

Sun, J. P. et al., "Resonant Tunneling Diodes: Models and Properties," Proceedings of the IEEE, vol. 86, No. 4, Apr. 1998, pp. 641-661.

Mazumder, P. et al., "Digital Circuit Applictions of Resonant Tunneling Devices," Proceedings of the IEEE, vol. 86, No. 4, pp. 664-686, Apr. 1998.

News Release from www.eurekalert.org/releases/udel-udcnfib.html, "UD Computer News: Future Looks Bright for Tunnel Diodes, Promising Faster, More Efficient Circuits, "Oct. 1, 1998, 4 pages.

Seabaugh A. et al., "Resonant Tunneling Mixed Signal Circuit Technology," Solid-State Electronics 43:1355-1365, 1999.

Wirth, G. et al., "Negative Differential Resistance in Ultrashort Bulk MOSFETs," IECON'99 Conference Proceedings, vol. 1, San Jose, 1999, pp. 29-34.

Mathews, R. H. et al., "A New RTD-FET Logic Family," Proceedings of the IEEE, vol. 87, No. 4, pp. 596-605, 1999.

Van Der Wagt, J. P. A., "Tunneling-Based SRAM," Proceedings of the IEEE, vol. 87, No. 4, pp. 571-595, 1999.

Heij, C. P. et al., "Negative Differential Resistance Due to Single-Electron Switching," Applied Physics Letters, vol. 74, No. 7, Feb. 15, 1999, 5 pages.

Pacha, C. et al., "Resonant Tunneling Device Logic Circuits," Microelectronics Advanced Research Initiative (MEL-ARI,) Jul. 1998-Jul. 1999, pp. 1-22.

Hong, J.W. et al., "Local charge trapping and detection of trapped charge by scanning capacitance microscope in SI02/SI system," Appl. Phys. Lett., 75 (12), Sep. 20, 1999, pp. 1760-1762.

Haddab, Y. et al., "Quantized current jumps in silicon photoconductors at room temperature," J. Appl. Phys. 86 (7), Oct. 1, 1999, pp. 3787-3791.

Seabaugh, A., "Promise of Tunnel Diode Integrated Circuits," Tunnel Diode and CMOS/HBT Integration Workshop, Dec. 9, 1999, Naval Research Laboratory, Washington, DC., 13 pages.

Zhang, J., "Traps: Detrapping," Wiley Encyclopedia of Electrical and Electronics Engineering Online, Article Posting Date: Dec. 27, 1999, John Wiley & Sons, Inc., 4 pages.

Zhang, J., "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Zhang, J., "Traps: Measurement Techniques," Wiley Encyclopedia of Electrical and Electronics Engineering Online, Article Posting Date: Dec. 27, 1999, John Wiley & Son, Inc., 5 Pages.

Zhang, J., "Traps," Wiley Encyclopedia of Electrical and Electronics Engineering Online, Article Posting Date: Dec. 27, 1999, John Wiley & Sons, Inc., 2 pages.

Zhang, J., "Traps: Trapping Kinectics," Wiley Encyclopedia of Electrical and Electronics Engineering Online, Article Posting Date: Dec. 27, 1999, John Wiley & Sons, Inc., 2 pages.

Zhang, J., "Traps: Origin of Traps," Wiley Encyclopedia of Electrical and Electronics Engineering Online, Article Posting Date: Dec. 27, 1999, John Wiley & Sons, Inc., 4 pages.

Gonzalez, A. et al., "Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

Karna, Shashi P. et al., "Point defects in SI-SI02 systems: current understanding," Published in G. Pacchioni et al. (eds.), "Defects in SI02 and related dielectrics: science and technology," Kluwer Academic Publishers, (2000), 19 pages.

King, Tsu-Jae et al., U.S. Appl. No. 09/602,658, entitled "CMOS Compatible Process for Making a Tunable Negative Differential Resistance (NDR) Device," filed Jun. 22, 2000, 33 pages.

King, Tsu-Jae et al., U.S. Appl. No. 09/603,101, entitiled "CMOS-Process Compatible, Tunable NDR (Negative Differential Resistance) Device and Method of Operating Same," filed Jun. 22, 2000, 34 pages.

King, Tsu-Jae et al., U.S. Appl. No. 09/603,102, entitled "Charge Trapping Device and Method for Implementing a Transistor having a Negative Differential Resistance Mode," filed Jun. 22, 2000, 39 pages.

Geppert, Linda, "Quantum transistors: toward nanoelectronics, " IEEE Spectrum, Sep. 2000, pp. 46-51.

Seabaugh, A. et al., "Tunnel-Diode IC," Minneapolis, Oct. 2, 2001, 23 pages.

Believed to be published in: Deen, Jamal (editor) et al., excerpt from "CMOS RF modeling, characterization and applications," World Scientific, Apr. 2002, 34 pages.

Scoffield, John H. et al., "Reconciliation of different gate-voltage dependencies of 1/f noise in n-MOS and p-MOS transistors,"IEEE Trans. Electron. Dev. 41 (11), 11 pages.

Final Report: SMILE MEL-ARI Project n°28741—Chapter V, pp. 184-194.

Villa, S. et al. "Application of 1/f noise measurements to the charcterization of near-Interface oxide state in ULSI n-MOSFETs," Dipartimento di Elettronica e Informazione, Politecnico di Milano (Italy), 7 pages.

Nemati, F. et al., "A Novel High Density, Low Voltage SRAM Cell With a Vertical NDR Device," Center for Integrated Systems, Stanford University, CA, (2 pages).

Nemati, F. et al., "A Novel Thyristor-based SRAM Cell (T-RAM) for High-Speed, Low-Voltage, Giga-scale Memories," Center for Integrated Systems, Stanford University, CA, (4 pages).

Shoucair F. et al., "Analysis and Simulation of Simple Transistor Structures Exhibiting Negative Differential Resistance," EECS Department, UC Berkeley, CA, (4 pages).

Oberhuber, R. et al., "Tunnel-Devices with Negative Differential Resistivity Based on Sillicon?," Source: Deutsche Forschungsgemeinschaft and Siemens AG, date unknown, 2 pages.

* cited by examiner

N-Channel MOSFET (A)

P-Channel MOSFET (B)

Switchable N-Channel NDR FET (C)

| $V_{IN}$ | NMOS state | PMOS state | $V_{OUT}$ |
|---|---|---|---|
| GND | OFF | ON | $V_{DD}$ |
| $V_{DD}$ | ON | OFF | GND |

| $V_{IN}$ | NMOS state | SNDR-FET state | | $V_{OUT}$ |
|---|---|---|---|---|
| GND | OFF | ON | Non-NDR | $V_{DD}$ |
| $V_{DD}$ | ON | OFF | NDR | GND |

Fig. 7

N-CHANNEL PULL-UP ELEMENT AND LOGIC CIRCUIT

FIELD OF THE INVENTION

This invention relates to semiconductor devices and circuits, and more particularly to applications that employ pull-up elements and can benefit from single-channel logic gates, including inverters and other logic gates.

BACKGROUND OF THE INVENTION

Rapid advances in the semiconductor industry have enabled the proliferation of electronic devices and information technology over the past three decades. Integrated circuits (ICs) fabricated on pieces ("chips") of silicon—the predominant semiconductor material—can perform many electronic functions (computing, signal processing, information storage, etc.) efficiently and cheaply, and so they are used in virtually every electronic device produced today. With each new generation of semiconductor manufacturing technology, improvements in circuit performance (speed) are achieved simultaneously with reductions in cost per function, leading to greater demand and the development of new and improved products. Market growth leads to further investments to advance the technology, which in turn fuels continued growth. The semiconductor market has grown historically at an average rate of 15% per year, and exceeded $200 billion in 2000.

Transistors are the basic electronic building blocks used in ICs. A modern microprocessor employs over 50 million transistors on a silicon chip slightly larger than 1 cm$^2$. By reducing the size of these building blocks ("transistor scaling"), the size of the IC is commensurately reduced. The smaller the area required by a single IC, the larger the number of ICs that can be fabricated on a single silicon wafer. Assuming that the cost of processing a single wafer increases only slightly as compared with the increase in the number of chips per wafer, the cost per IC is thereby significantly reduced. Fortuitously, transistors operate at higher speeds as they are scaled down in size, to provide concomitant improvements in circuit performance.

Figure 1:
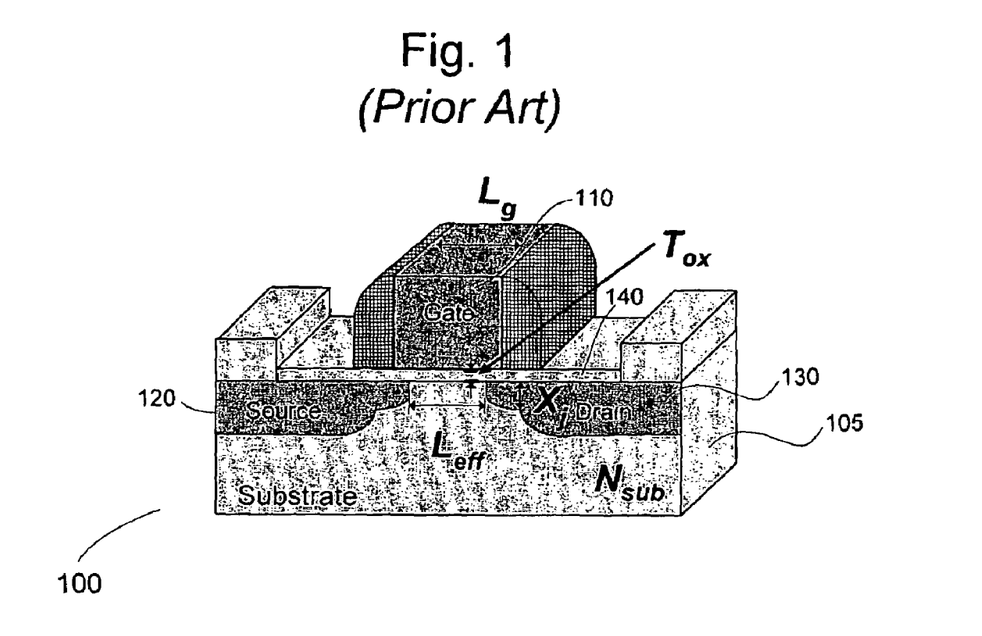
FIG. 1 is a schematic cross-sectional view of a prior art metal-insulator-semiconductor field-effect transistor (MISFET)

A transistor is essentially a three-terminal semiconductor device which functions essentially as an electronic switch: the current flowing between two terminals is controlled by a voltage or current applied to the third terminal. The vast majority (>85%) of ICs produced today employ metal-oxide-semiconductor field-effect transistors (MOSFETs) as the basic building blocks. In a MOSFET, the voltage on the metal (which can also be a doped polysilicon material) "gate" terminal 110 controls the current flowing in a semiconductor channel on a substrate 105 between the "source" 120 and "drain" 130 regions as seen in FIG. 1. The metal gate electrode 110 and semiconductor channel are electrically insulated from each other by a very thin oxide layer 140 (hence the name "metal-oxide-semiconductor" sometimes also referred to more genetically as "metal-insulator-semiconductor" or MISFET).

MOSFETs can be classified, by among other things, their channel conductivity type: "n-channel" MOSFETs (NMOSFETs), which turn on (so that current flows freely in response to a voltage applied between the source and drain terminals) when a high voltage with respect to the source is applied to the gate; and "p-channel" MOSFETs (PMOSFETs), which turn on when a low voltage with respect to the source is applied to the gate. The source terminal of an NMOSFET is usually tied to a low electric potential (e.g. ground potential, 0 Volts), whereas the source terminal of a PMOSFET is usually tied to a high electric-potential (e.g. the power-supply voltage, $V_{DD}$).

The basic MOSFET structure, with key parameters labeled in FIG. 1 includes: gate length $L_g$; electrical channel length ($L_{eff}$); gate-oxide thickness $T_{ox}$; and source/drain junction depth $X_j$. Ideally, carriers can flow from the source terminal to the drain terminal only when the voltage applied to the gate electrode relative to the source is greater than a threshold voltage $V_T$; i.e. $|I_{DS}|>0$ when $|V_{GS}-V_T|>0$.

Again, in an n-channel MOSFET (NMOSFET), the source and drain regions are heavily doped n-type (i.e. so that they contain a high density of conduction-band electrons—which have negative charge), whereas the channel region is doped p-type (i.e. it does not have a high density of conduction-band electrons, but rather has an abundance of valence-band holes—which have positive associated charge). Conduction-band electrons flow from the source to the drain only when an n-type inversion layer of electrons is formed at the surface of the channel, by applying a suitably large positive gate voltage relative to the source. When its source terminal is biased at a low voltage (as is typically the case in a CMOS circuit), an NMOSFET is turned on by applying a high gate voltage $V_G$.

Conversely, in a p-channel MOSFET (PMOSFET), the source and drain regions are heavily doped p-type, whereas the channel region is doped n-type. Valence-band holes flow from the source to the drain only when a p-type inversion layer of holes is formed at the surface of the channel, by applying a suitably large negative gate voltage relative to the source. When its source terminal is biased at a high voltage (as is typically the case in a CMOS circuit), a P MOSFET is turned on by applying a low gate voltage $V_G$.

Figure 5A:
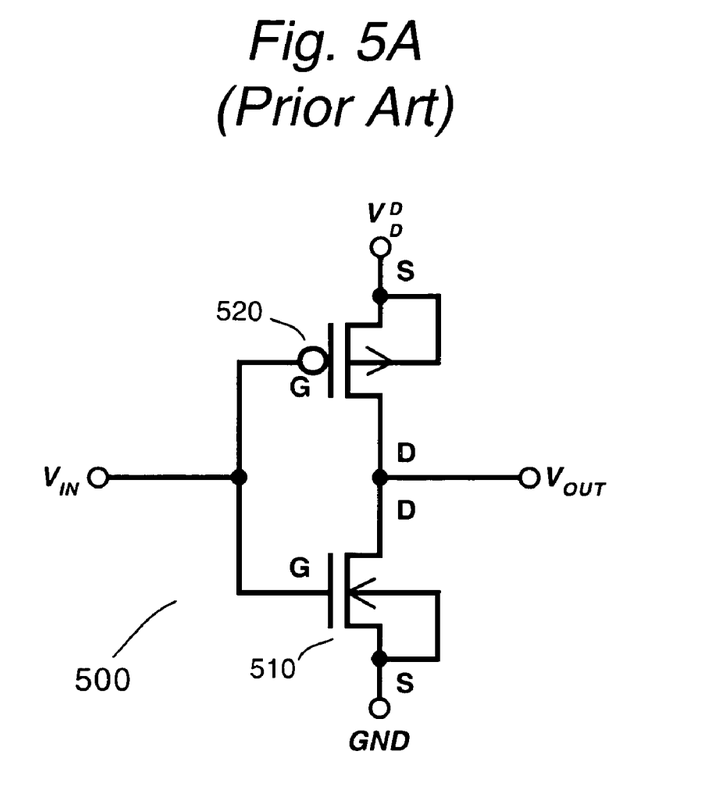
FIG. 5A is an electrical circuit diagram of a prior art CMOS inverter.
Figure 5B:
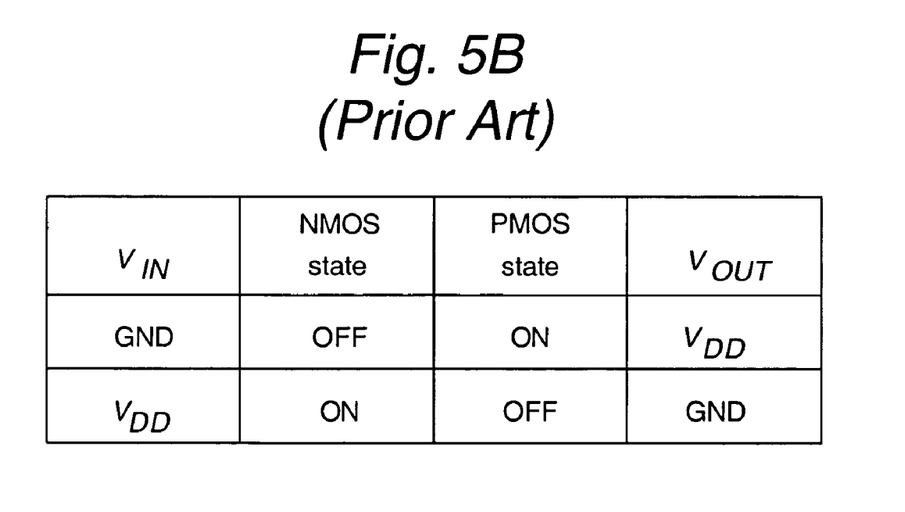
FIG. 5B is a logic table describing the operation of a prior art CMOS inverter.

If the gate terminals of an NMOSFET and PMOSFET are tied together to an input signal line $V_{IN}$, and their drain terminals are also tied together to an output signal line $V_{OUT}$, a conventional CMOS inverter circuit 500 is formed as seen in FIG. 5A: for a high input bias ($V_{IN}=V_{DD}$), the NMOSFET 510 is ON (and can be simply modeled as a closed switch between the source and drain terminals) whereas the PMOSFET 520 is OFF (and can be simply modeled as an open switch), so that the output is connected to the ground potential ($V_{OUT}=0$ V); conversely, for a low input bias ($V_{IN}=0$V), the NMOSFET is OFF (modeled as an open switch) whereas the PMOSFET is ON (modeled as a closed switch), so that the output is connected to the power-supply voltage ($V_{OUT}=V_{DD}$). Thus, in the operation— of an inverter, the NMOSFET functions to "pull down" the output potential (when a high input signal is applied), and the PMOSFET functions to "pull up" the output potential when a low input signal is applied. This operation is set out in FIG. 5B. For this reason, the PMOSFET is sometimes referred to as a pull-up element, and in memory applications for example is sometimes referred to as a load element. When implemented in silicon, the NMOSFET and PMOSFET reside in separate doped regions ("wells"). The NMOSFET substrate (p-type well) is biased at GND, while the PMOSFET substrate (n-type well) is biased at $V_{DD}$.

The inverter 500 of FIG. 5A is a primary building block of numerous larger scale collections of electronic circuits in integrated circuit semiconductor applications. Various other logic functions are also achieved with appropriate combinations of NMOSFET pull-down and PMOSFET pull-up devices. Since the NMOSFET and PMOSFET operate in a complementary fashion, circuits that employ both types of MOSFETs together are called "complementary MOS" (CMOS) circuits. CMOS technology is predominantly used for very large scale integrated (VLSI) circuits today, primarily because of its low power consumption (since there is no direct current conduction path between $V_{DD}$ and 0 V when the transistors are not being switched) and its large static noise margin (i.e. $V_{OUT}$ can vary across the full range from 0 V to $V_{DD}$) as compared with all-NMOS or bipolar junction transistor technologies. The length of the gate electrode in a state-of-the-art CMOS manufacturing process (130-nm generation) is 65 nanometers (nm), and it is scaled by ~70% with each new technology generation (every 1.5 years).

Scaling of CMOS technology is nonetheless increasingly difficult, due to technological and physical limitations. As the lateral dimensions of the transistor are reduced, the vertical dimensions must be proportionately reduced, in order to ensure that it can be turned off effectively when the gate voltage is low ($\leq 0$ Volts). For example, the depth of the source and drain regions must be reduced in order to maintain a low level of leakage current flowing between these regions when the transistor is in the OFF state. In general, the impurity atoms ("dopants") which are incorporated to form the source and drain regions of a PMOSFET diffuse much more quickly than those for an NMOSFET, which makes it challenging to form highly conductive, ultra-shallow (<20 nm deep) source and drain regions in an integrated CMOS process. (High annealing temperatures are required to "activate" the dopants and thereby achieve high conductivity source and drain regions, but the rate of dopant diffusion increases exponentially with increasing temperature.)

As another example, the capacitive coupling between the gate electrode and the channel must be increased in order to ensure that channel potential can be adequately controlled by the gate bias (vs. the drain bias) in the OFF state. Historically, this has been achieved by reducing the physical thickness of the "gate oxide" between the gate electrode and the channel. In state-of-the-art CMOS devices, the gate oxide is ~2 nm thick. The onset of quantum-mechanical tunneling of electrons—manifested as undesirable gate leakage current—will prevent gate-oxide scaling to below ~1 nm physical thickness. The power-supply voltage has been reduced with transistor scaling, but more slowly than the gate-oxide thickness. As a result, higher vertical electric fields (several MV/cm) must be sustained across the thin gate oxides in sub-100-nm MOSFETs. This can lead to reliability problems, particularly for PMOS devices, in which the polarity of the vertical electric field is negative (pointing in the direction from the channel to the gate).

Polycrystalline silicon (poly-Si) is employed as the MOSFET gate-electrode material in modern CMOS technologies. Typically, it is heavily doped n-type or p-type for NMOSFETs or PMOSFETs, respectively, formed by dopant ion implantation and subsequent thermal annealing. Because it is a semiconductor material (rather than a truly metallic material), it becomes depleted of mobile carriers (i.e. it becomes an insulating material) in a region next to the gate oxide whenever the transistor is turned on. The "gate depletion effect" increases the effective oxide thickness by several Angstroms in the ON state, decreasing the gate capacitance and resulting in degraded transistor ON current. This effect becomes very significant when the physical oxide thickness is <3 nm. To eliminate this effect, the use of metallic gate materials is desirable. NMOSFETs require a gate material with low work function (comparable to that of heavily doped n-type poly-Si), while PMOSFETs require a gate material with high work function (comparable to that of heavily doped p-type poly-Si). The process integration of different metallic gate materials is a major technological challenge for metal gate CMOS technology, in part because the characteristics of the two different types of MOSFETs inherently mandate different types of gate materials.

Another issue associated with using p-channel devices in inverters and other circuits is the fact that "holes," rather than electrons, form the mobile carriers in the channel. It is well-known that holes have significantly reduced mobility compared to electrons, and for this reason, with all things being equal, a p-channel device has markedly reduced performance compared to an n-channel device of the same size and biasing. This makes timing and characterization of circuits more complicated, since the behavior of the two different types of devices must be taken into account. Furthermore, to compensate for this speed discrepancy, p-channel devices typically must be made larger than their n-channel counterparts, which further reduces integration density.

To eliminate (or at least alleviate) the aforementioned issues for MOSFET scaling in the sub-100-nm regime, it is desirable to eliminate PMOSFETs in VLSI circuits. By using only NMOSFETs, the IC fabrication process is greatly simplified (e.g. there would be no need to co-optimize the fabrication process for both n-type and p-type source/drain junctions, and a single metal gate material would be adequate). In addition, since PMOSFETs must be fabricated in separate regions (n-type "wells") isolated from NMOSFETs (built in p-type "wells"), the elimination of PMOSFETs will provide for significant improvement in transistor layout density (smaller chip size). An all-NMOS technology will therefore provide substantial reductions in cost.

The prior art has attempted various solutions to provide a single channel technology for logic gates and other circuit applications. For example, in U.S. Pat. No. 4,072,868, an n-channel depletion mode IGFET device is used as a load element, along with an channel enhancement mode IGFET device as the driver. The disadvantages of this technique include the fact that the processing is not entirely simplified because the n-channel devices must still be formed in different regions of a substrate. Furthermore, the load element is in a constant conduction state since the gate of the load element is tied to a fixed potential. This means that the device consumes power in all operational modes, and thus is not suitable for low power applications. In U.S. Pat. No. 5,191,244, an n-channel pull-up transistor is used, but as it must be coupled to both a discharging transistor and a coupling transistor, it is plainly not suitable as an effective substitute in the majority of applications for a conventional p-channel device. Similarly, in U.S. Pat. No. 5,495,195, an n-channel pull-up element is used as a supplement (but not as a replacement) to a conventional inverter to increase switching speed. The general problems encountered to date, therefore, when using n-channel devices as pull-up devices include the following: (1) the depletion mode transistor must be made large (i.e., long and thin) to create a large ON resistance; (2) when driving a capacitive output load such as the gate of another transistor, the charging time is long compared to the discharging time; (3) the device consumes DC power whenever the enhancement mode pull down device is turned on, due to the resistive losses in the pull-up transistor.

Thus, the solutions described in these references (which are hereby incorporated by reference) and the other prior art are clearly not optimal, or at least do not provide any measurable advantage over their CMOS counterparts. For these reasons, single channel based circuits have not achieved commercial success to date despite their promise.

It would be desirable, therefore, to provide a new type of n-channel MOSFET to replace the PMOSFET as a pull-up device in a complementary integrated circuit, one which allows the benefits of a CMOS technology (lower standby power, large static noise margin) to be retained. Specifically, this new transistor should be OFF when the input (gate) bias is high, and it should be ON when the input bias is low. The DC current consumed in the pull-up element must be close to zero when the pull-down element is on.

One promising candidate that is suitable as an n-channel pull-up element is a new type of MOS compatible, NDR capable FET described in U.S. Pat. No. 6,479,862 to King et al The advantages of such device are well set out in such document and ate not repeated here. As set forth herein, it is believed that appropriate configurations of such new element can function effectively as drop-in replacements for conventional p-channel devices, and thus solve the long-standing problem of the complexities of CMOS technologies, and the impending scaling problems of the same.

SUMMARY OF THE INVENTION

Accordingly, an object of the present invention is to overcome the aforementioned deficiencies in the prior art;

Another object of the present invention is to provide a new type of pull-up element that includes a switchable NDR FET;

Still a further object of the present invention is to provide new types of single channel logic gates, including inverters;

Another object of the present invention is to provide a new type of semiconductor element that imitates a behavior of another device of a different conductivity type;

A related object is to provide an n-channel FET that operates essentially like a p-channel FET, and thus can be used as an effective replacement for the latter.

Yet another object of the present invention is to provide a new type of semiconductor building block that competes effectively with CMOS counterparts, including from a cost, complexity and performance perspective.

It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions.

A first aspect of the invention, therefore, concerns an n-type channel semiconductor transistor device which responds to a gate input bias signal and a source-drain bias signal and switches in a similar manner to that which a p-channel semiconductor transistor device would in response to the gate input bias signal and the source-drain bias signal.

In a preferred embodiment, a trapping layer located at a channel interface of the n-channel semiconductor transistor device causes the n-channel semiconductor transistor device to operate in negative differential resistance mode when the gate input bias signal and the source-drain bias signal exceed predetermined thresholds. An onset point for the gate input bias signal is set to a value equal approximately to a $V_{DD}/2$, where $V_{DD}$ is a maximum operating potential for the n-type channel semiconductor transistor device.

Again in a preferred embodiment, the n-type channel semiconductor transistor device is configured as a negative differential resistance depletion mode device. Thus, in response to the gate input bias signal having a high logic level the n-type channel semiconductor transistor device operates with a negative differential resistance region (and thus can be shut off like a p-channel device), and in response to the gate input bias signal having a low logic level the n-type channel semiconductor transistor device operates without a negative differential resistance region (and thus turns on like a p-channel device).

Another aspect of the invention is directed to an n-type channel semiconductor transistor device that is is doped so that it operates as a depletion mode device, and is further further adapted such that: in response to a predetermined source-drain voltage and a low gate voltage potential, the n-channel transistor semiconductor transistor device turns on; and in response to the predetermined source-drain voltage and a high gate voltage potential, the n-channel transistor semiconductor transistor turns off The n-type channel semiconductor transistor device is preferably a metal-insulator field effect transistor (MISFET) which includes a switchable negative differential resistance. The predetermined source-drain voltage is greater than an onset voltage for a negative differential resistance characteristic for the n-type channel semiconductor transistor device. In other embodiments the n-type channel semiconductor transistor device is formed in a silicon-on-insulator substrate.

Another aspect of the invention is directed to a gated semiconductor structure adapted to exhibit a negative differential resistance (NDR) effect in a channel region during a first mode of operation. This mode is achieved in response to a gate input signal exceeding a first voltage value. The gated semiconductor structure is further adapted to suppress the negative differential resistance effect during a second mode of operation in the channel region in response the gate input signal not exceeding the first voltage value. A drain region coupled to the gated semiconductor structure is configured for receiving a drain voltage potential. The resulting structure has a behavior wherein during the first mode of operation the semiconductor device has a gate input signal having a logical high level and can be switched off in response to the drain voltage potential exceeding an NDR onset value ($V_{NDR}$); and during the second mode of operation the semiconductor device is switched on in response to the gate input signal attaining a logical low level. In this manner, the gated semiconductor structure imitates a switching characteristic of a p-channel FET.

The gated semiconductor structure is preferably a silicon based structure in which the negative differential resistance effect is caused by charge trapping and charge de-trapping at an interface with a channel of the gated semiconductor structure. In some embodiments, the gated semiconductor structure is a field effect transistor with a dynamically variable threshold voltage.

A further aspect of the invention is directed to an n-channel transistor for use in a semiconductor circuit. The n-channel transistor includes a gate, a source region, a drain region, and a channel coupling the source region and drain region. The n-channel transistor is configured so that in response to a first value of a gate bias signal the n-channel transistor can be switched on and off based on the gate bias signal controlling a channel conductivity. At the same time, the n-channel transistor is also configured so that in response to a second value of the gate bias signal the n-channel transistor can be switched on and off in response to a source/drain bias signal controlling the channel conductivity. In this way, the n-channel transistor constitutes an n-channel depletion mode device that switches substantially like a p-channel device in response to the gate bias signal in the semiconductor circuit.

In a preferred approach, the first value of the gate bias signal corresponds to a low logic level state, and the second value of the gate bias signal corresponds to a high logic level state.

In some embodiments the drain region is a common doped region shared by another n-channel transistor that switches substantially like an n-channel device. In other embodiments, the n-channel transistor is formed on a silicon-on-insulator substrate. In still other instances the n-channel transistor has a channel length that is slightly larger than a channel length of other n-channel devices in the semiconductor circuit that do not operate like a p-channel device.

Other aspects of the invention are directed to new types of semiconductor pull-up elements for use in a silicon based semiconductor circuit. A first type of pull-up comprises an n-channel field effect transistor, including a source, a drain, a channel and a gate. The drain is coupled to a first voltage potential, and the source is coupled to an output node. The n-channel field effect transistor is configured in a depletion mode to switch on and off in a similar manner to that which a p-channel FET would respond to a gate input bias signal, such that: in response to a low gate input bias signal, and a low source-drain potential the n-channel FET turns on; in response to a high gate input bias signal, and a high source-drain potential the n-channel FET turns off. In this configuration, the semiconductor pull-up element is an active n-channel device that imitates a behavior of an active p-channel device by switching on and off to reduce power consumption in the silicon based semiconductor circuit.

In a preferred embodiment the n-channel field effect transistor includes a switchable negative differential resistance characteristic. The pull-up element is coupled in series with another n-channel field effect transistor (pull-down element) which switches as an n-channel device in response to the gate input bias signal. The n-channel field effect transistor consumes substantially zero DC power when a pull-down element coupled to the n-channel field effect transistor is turned on.

In some embodiments the n-channel field effect transistor is part of a Boolean logic gate (AND, NAND, OR, NOR, XOR, XNOR, NOT).

Another aspect of the invention concerns a logic gate including at least one first dopant type channel insulated gate field effect transistor (IGFET) and an NDR FET element with the same dopant type channel. The first-channel type IGFET has an IGFET gate terminal coupled to an input node, a first IGFET source/drain terminal connected to a first potential, and a second IGFET source/drain terminal coupled to an output node. A negative differential resistance field-effect transistor (NDR-FET) element also has a first dopant-type channel, including a first NDR FET source/drain terminal connected to a second potential, a second NDR source/drain terminal connected to the output node, and a third NDR gate terminal connected to the input node. In this manner, the NDR FET element operates as a pull-up device for the logic gate, so that the logic gate is formed entirely of active devices having a common channel dopant type.

In a preferred embodiment, the NDR FET element is a depletion mode device, and the devices are both n-channel. In highly integrated applications, an output node is a source/drain region shared by the NDR FET and the IGFET.

The logic gate can implement a standard a Boolean logic function, including for example AND, OR, NOT, NAND, NOR, XOR, XNOR. Larger combinations of functions are also possible of course.

Another aspect of the invention covers a logic gate comprising a first n-channel device coupled to an input signal and an output node; and a second n-channel device connected in series with the first-channel device. The first n-channel device imitates a switching behavior of a p-channel field effect transistor in response to a value of the input signal.

The first n-channel device is preferably a switchable depletion mode negative differential resistance field effect transistor (SNDR FET), which gets its behavior from a trapping region.

In some applications, a first resistance of the first n-channel device is larger than a second resistance of the second n-channel device.

Another aspect of the invention concerns a semiconductor circuit comprising: a first n-channel field effect transistor pull-up element having a gate coupled to an input signal associated with the semiconductor logic gate; and a second n-channel FET pull-down element connected in series with the first-channel device and also having a gate directly coupled to the input signal. The first n-channel device is placed in an ON state and the second n-channel device is placed in an OFF state in response to the input signal having a first logic level value, and the first n-channel device is placed in an OFF state and the second n-channel device is placed in an ON state in response to the input signal having a second logic level value. Thus, the semiconductor circuit is implemented entirely with n-channel devices.

In many applications, the all n-channel semiconductor circuit can be constructed to imitate CMOS behavior, such as by dissipating substantially zero DC power during static operation. In some embodiments, an entire an integrated circuit die, or even an entire silicon wafer can be manufactured to have only n-channel devices, thus simplifying fabrication processes significantly.

Other aspects of the invention pertain to methods of operating an n-channel silicon based semiconductor transistor. Such methods include: applying a low bias signal to a gate of the n-channel silicon based semiconductor transistor and a first source-drain bias to place the n-channel silicon based semiconductor transistor in an ON state; and applying a high bias signal to the gate of the n-channel silicon based semiconductor transistor and a second source-drain bias, different from the first source-drain bias, to place the n-channel silicon based semiconductor transistor in an OFF state. From an operational perspective therefore, the n-channel silicon based semiconductor transistor responds to a gate bias signal substantially like a p-channel FET.

Related aspects include methods of operating a negative differential resistance (NDR) field effect transistor (FET) device. These methods include: applying a low bias signal to a gate of the NDR FET and a first source-drain bias to place the NDR FET in an ON state; and applying a high bias signal to the gate of the NDR FET and a second source-drain bias, different from the first source-drain bias, to place the NDR FET in an OFF state. In this fashion, the NDR FET switches substantially like a p-channel FET.

In a preferred embodiment, the NDR FET is a depletion mode n-channel device.

In some applications, the NDR FET can be configured with an OFF switching time in an NDR mode of operation that is approximately equal to an OFF switching time in a non-NDR mode of operation. Furthermore, the NDR FET dissipates substantially zero DC power during a static mode of operation in the OFF state, and is useful therefore as a pull-up element.

Other related aspects of the invention concern methods of operating an n-channel semiconductor pull-up element for use in a silicon based semiconductor circuit. These methods generally include the steps of: coupling a drain of the n-channel semiconductor pull-up element to a first voltage potential, and a source to an output node and a drain of an n-channel pull-down element; coupling a gate of the n-channel semiconductor pull-up element to an input signal; selectively switching a negative differential resistance (NDR) mode for the n-channel semiconductor pull-up element; and operating the n-channel semiconductor pull-up element in a depletion mode to switch on and off in a similar manner to that which a p-channel FET would respond to an input bias signal, such that: in response to a low gate input bias signal the n-channel semiconductor pull-up element turns on; in response to a high gate input bias signal, and a high source-drain potential the n-channel semiconductor pull-up element turns off. From an operational perspective, therefore, these embodiments provide the advantage of an n-channel semiconductor pull-up element that imitates a switching behavior of an active p-channel device to reduce power consumption in the silicon based semiconductor circuit.

Related aspects of the invention concern methods of operating a semiconductor circuit in which an n-channel negative differential resistance (NDR) field effect transistor as a pull-up element, and wherein during a first mode of operation the n-channel NDR FET operates with an NDR characteristic in response to an input signal exceeding a first voltage value; the n-channel NDR FET being further adapted to suppress the negative differential resistance effect during a second mode of operation in response to the input signal not exceeding the first voltage value. During the first mode of operation the n-channel NDR FET can be switched off in response to a drain voltage potential exceeding an NDR onset value ($V_{NDR}$); during the second mode of operation the semiconductor device is switched on in response to the input signal attaining a logical low level. Thus, two different degrees of freedom are available to turn off the pull-up element.

Other aspects of the invention relate to methods of making semiconductor devices, including forming an n-channel switchable depletion mode negative differential resistance field effect transistor (SNDRFET) which has a switching characteristic that is substantially the same as a p-type FET.

Still other aspects of the invention pertain to methods of making single channel semiconductor circuits. These include generally the following steps: forming a first n-channel field effect transistor pull-up element having a gate coupled to an input signal associated with the semiconductor circuit; and forming a second n-channel FET pull-down element connected in series with the first-channel device and also having a gate directly coupled to the input signal. The first n-channel device is placed in an ON state and the second n-channel device is placed in an OFF state in response to the input signal having a first logic level value; and the first n-channel device is placed in an OFF state and the second n-channel device is placed in an ON state in response to the input signal having a second logic level value. Thus, as fabricated, the semiconductor circuit is implemented entirely with n-channel devices, and yet behaves analogously to a CMOS type circuit.

In this fashion, an NDR pull-up element can be constructed that is integrated into a conventional fabrication process much easier than conventional PMOSFETs. Furthermore, logic gates can be made so that all devices in such gates use a single channel type (i.e., both are n-channel or p-channel), and yet still achieve low power operation as with CMOS implementations.

DETAILED DESCRIPTION OF PREFERRED EMBODIMENTS

The following detailed description is meant to be illustrative only of particular embodiments of the invention. Other embodiments of the invention and variations of those disclosed will be obvious to those skilled in the art in view of the following description.

As noted above, a novel method of achieving significant negative differential resistance (NDR) behavior in a silicon-based n-channel MOSFET has previously been disclosed. In an NDR-FET 200 shown in FIG. 2, electron traps 230 are located in a gate dielectric 210 next to a channel, within a very short distance <1 nm from the surface of a semiconductor substrate 205. The other components of NDR FET 200 are conventional, and include a source region 240 (and source terminal/contact 245); a drain region 250 (and drain terminal/contact 255; a gate electrode 260 (and gate terminal/contact 265), and an optional body contact 270.

Figure 2:
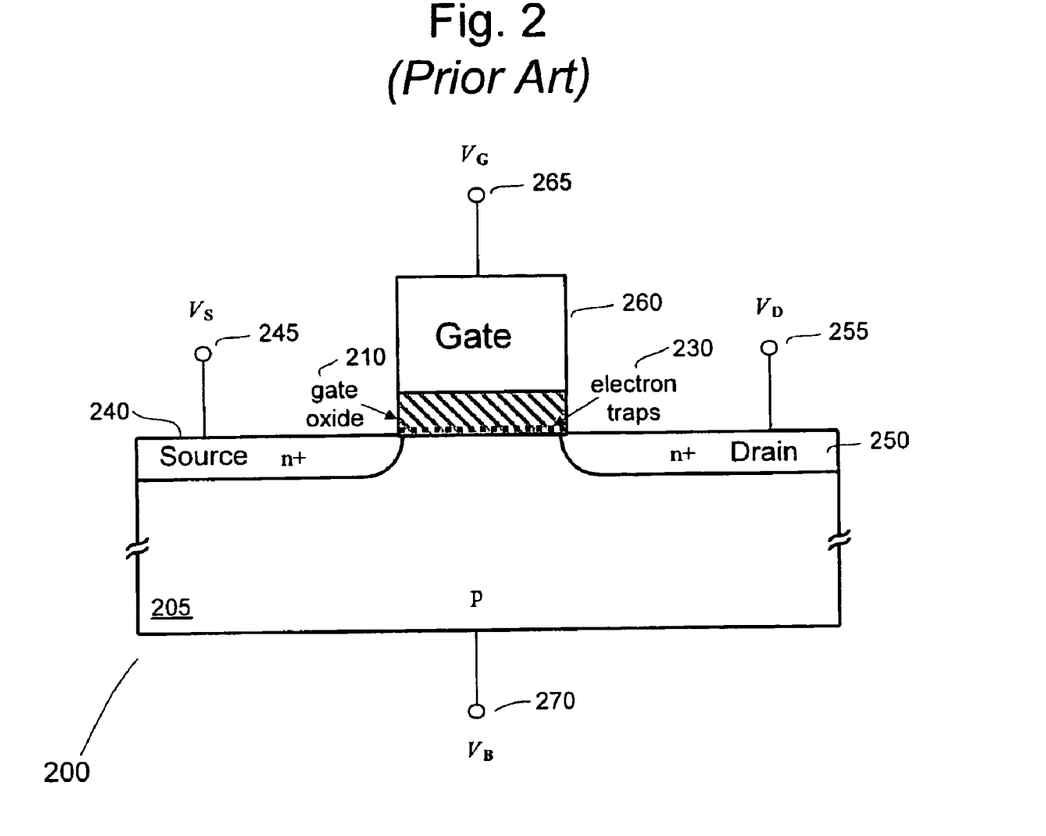
FIG. 2 is a schematic cross-sectional view of a prior art negative differential resistance (NDR) capable metal-insulator-semiconductor field-effect transistor (NDR-MISFET)

The traps 230 have a moderately high energy level and capture only energetic electrons from the channel. Such energetic electrons are available only if the electric field strength in the channel region is sufficiently high, i.e. if the gate-to-channel bias and drain-to-source bias ($V_{DS}$) are sufficiently high. Once electrons are captured, the trapped charge in the gate dielectric causes the transistor threshold voltage $V_T$ to increase, and hence the transistor current ($I_{DS}$) decreases. As $V_{DS}$ increases, a larger fraction of the electrons flowing in the channel have sufficient energy to become trapped, so that the transistor current decreases further.

Because the trap energy level is high, the trapped electrons can escape rapidly (e.g. within $10^{-12}$ seconds). For each unique combination of biases, a steady state exists in which electrons are continually trapped and detrapped, with a fixed net trapped charge that affects the transistor threshold voltage $V_T$. Because of the high frequency (>$10^{12}$ Hz) of electron trapping/de-trapping, $V_T$ responds dynamically to changes in bias conditions, so that dynamic NDR behavior between the drain and source is achieved no matter which direction (positive or negative) $V_{DS}$ is scanned (FIG. 3).

Nonetheless, if the gate bias is not sufficiently high, the vertical electric field may not be sufficiently high to trap electrons from the channel, and an NDR behavior is not seen. In other words, NDR FET 200 can also behave like a conventional FET for other biasing conditions. This effectuates a dual mode device whose characteristics vary according to the mode selected.

Thus, the NDR behavior of NDR FET 200 is switchable (i.e. the NDR mode can be turned on and off) with a gate bias, and thus this device can be considered a form of "switchable" NDR-FET, referred to hereafter as an SNDR FET. Notably, when SNDR FET 200 is operating as a conventional FET, it can be turned on and off using a standard gate voltage. In contrast, when NDR FET is operating with an NDR characteristic, it can be turned on and off not only using a gate voltage, but also by action of the source/drain voltage noted earlier. This permits an extra degree of freedom and flexibility that is unlike any other known silicon based semiconductor transistor.

Figure 3:
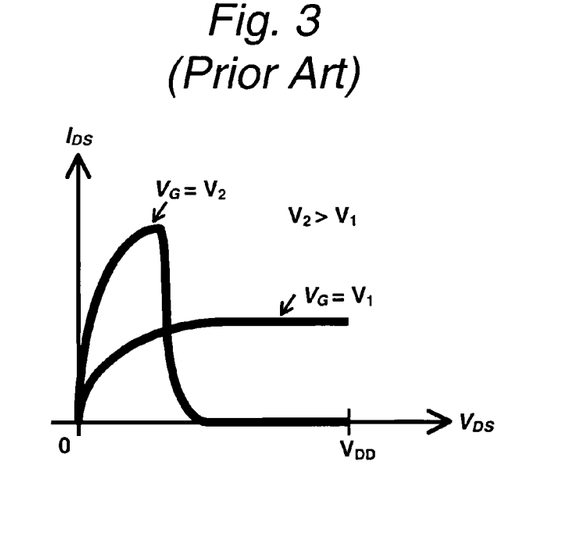
FIG. 3 is a graphical chart illustrating the current versus voltage (I-V) characteristics of an NDR-MISFET, including a first mode in which such device has an NDR operating region, and a second mode in which such device operates as a conventional FET.

The two operating modes are shown in FIG. 3, which shows the current ($I_{DS}$) vs. voltage ($V_{DS}$) characteristics of an SNDR-FET, for $V_S=V_B=$GND. For low gate bias ($V_G=V_1$), the characteristic is similar to that of an ordinary NMOSFET. For sufficiently high gate bias ($V_G=V_2$), electrons flowing in the channel gain enough energy at high drain-to-source bias to become trapped, causing $V_T$ to increase and current to decrease, yielding the negative differential resistance characteristic. The "NDR regime" corresponds to the bias range $V_{DS}>V_{NDR}$; the latter can be adjusted or "tuned" during manufacturing to achieve a desired operating range.

Figure 4:
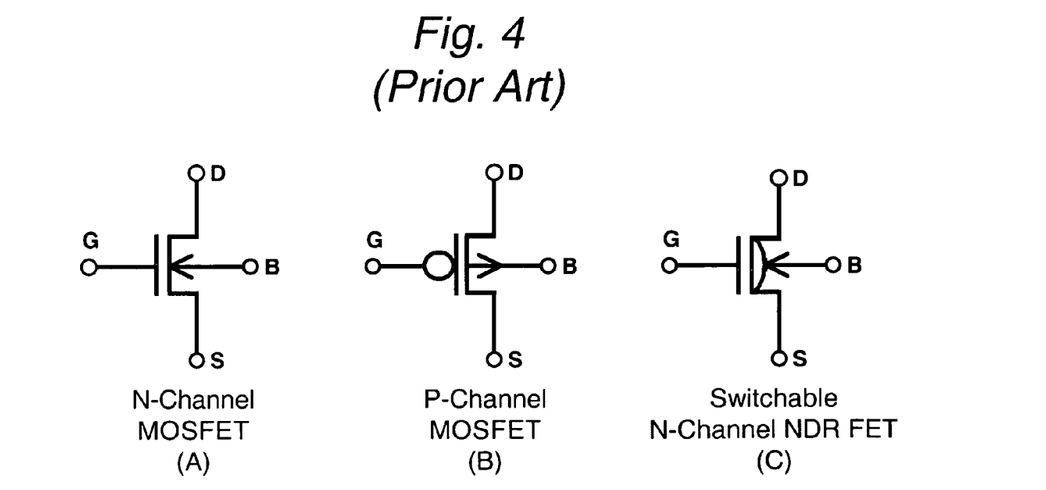
FIG. 4 illustrates various circuit symbols used to denote different types of electronic circuits as implemented in silicon.

FIG. 4(c) illustrates a new short-hand MOSFET circuit symbol that is employed in the drawings as an identifier for an SNDR FET when it is used in semiconductor circuits. This can be contrasted with various basic MOSFET circuit symbols that are known in the art, such as for a standard n-channel MOSFET (FIG. 4(a)) and a standard p-channel MOSFET (FIG. 4(b)). While the applicant does not object to the reproduction of the present document (and drawings) for any legal purpose, all rights in the use of such symbol (or derivatives thereof) to denote an NDR FET are reserved to the applicant.

A switchable NDR-FET (SNDR-FET) therefore can be used as a pull-up device (in place of a PMOSFET) in any complementary logic circuit. This permits an all n-channel logic gate, in which the active devices are formed in a single substrate (or well) with a common bias potential (preferably ground).

Figure 6A:
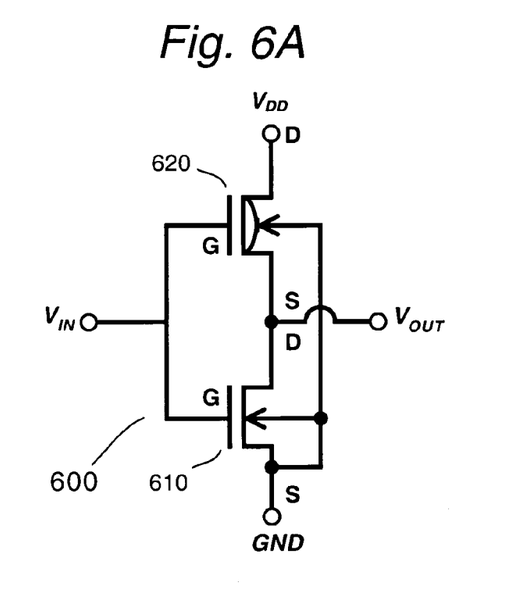
FIG. 6A is an electrical circuit diagram of a single-channel MOS logic gate (an inverter) constructed in accordance with the present teachings.

As an illustrative example, consider the embodiment of an inverter circuit 600 in FIG. 6, which includes an n-channel pull-down element 610 (preferably an NMOSFET) and an n-channel NDR pull-up element 620 (in this instance preferably a depletion mode type SNDR FET). SNDR FET 620 is constructed using conventional processing techniques so that it behaves like its conventional depletion mode FET counterpart. Thus, device 620 is normally on with a low gate voltage potential, and is turned off by raising the gate potential. The intrinsic threshold voltage of SNDR-FET 620 should be preferably less than or equal to $-V_{DD}$, so that it is a depletion-mode device. This can be done, of course, by simply doping the channel with an n-type dopant of some kind, in an appropriate fashion using well-known processing operations.

Thus, when the input signal transitions to a high state ($V_{IN}=V_{DD}$), the NMOSFET pull-down device 610 will turn on to pull $V_{OUT}$ low (below $V_{DD}/2$). This result is guaranteed if the ON resistance of SNDR-FET 620 is larger than the ON resistance of NMOSFET 610 for $V_{OUT}$-$V_{DD}/2$. In other words, the peak value of $I_{DS}$ for SNDR-FET 620 when it is in the NDR mode (corresponding to $V_{IN}=V_{DD}$, for worst-case consideration, and $V_{BS}=-V_{DD}/2$) should be lower than that of NMOSFET 610 for $V_{IN}=V_{DD}$ and $V_{OUT}=V_{DD}/2$, The SNDR-FET will then shut off (since it is biased in the NDR regime), and $V_{OUT}$ will reach GND, to provide low static power dissipation and large static noise margin.

As noted above, since SNDR-FET 620 is ON for $V_{IN}=$GND, the intrinsic threshold voltage $V_T$ of this device should be less than or equal to $-V_{DD}$. It should also be noted that $I_{DS}$ is somewhat degraded at high values of $V_{OUT}$ (>$V_{DD}/2$)— corresponding to low values of $V_{DS}$)— because the gate-to-source bias ($V_{GS}$) is less than $V_G$ (since $V_S=V_{OUT}>$GND) and also because $V_T$ is increased by the body bias effect ($V_{BS}<0 =>V_T$ higher than intrinsic value). A negative body bias also impacts $V_{NDR}$ (refer to FIG. 3): $V_{NDR}$ is lower for $V_{BS}<0$, so that an NDR regime of an SNDR-FET in this configuration spans a slightly wider voltage range. Again, the particular voltage range will vary in accordance with specific circuit operational requirements. It will be further understood by those skilled in the art that the body bias effect can be minimized by using a silicon-on-insulator (SOI) substrate, so that the body of SNDR-FET 620 is electrically floating.

Accordingly, for a first logic signal value applied to inverter 600 (in this case, a logical high value), SNDR FET 620 behaves with an NDR characteristic.

The ON resistance of NMOSFET 610 can be lowered by increasing its channel width relative to a channel width of SNDR-FET 620; this would result in a larger layout area for the inverter, which may be undesirable in some applications. Since the ON-state current of SNDR-FET 620 is already degraded (as a result of an NDR effect described in the preceding paragraph), it might not be necessary in practice to make NMOSFET 610 much wider than SNDR-FET 620. Other techniques for achieving an appropriate resistance match between the pull-down and pull-up elements will be apparent to those skilled in the art.

When the input signal transitions to a low state ($V_{IN}=$GND), NMOSFET pull-down device 610 shuts off, while SNDR-FET 620 switches to a non-NDR state, and behaves like a conventional depletion mode FET. This is because the gate bias is insufficiently high for charge trapping to occur. Consequently, SNDR FET 620 turns ON to pull $V_{OUT}$ high. Accordingly, for a second logic signal value applied to inverter 600 (in this case, a logical low value), SNDR FET 620 behaves without an NDR characteristic.

Figure 6B:
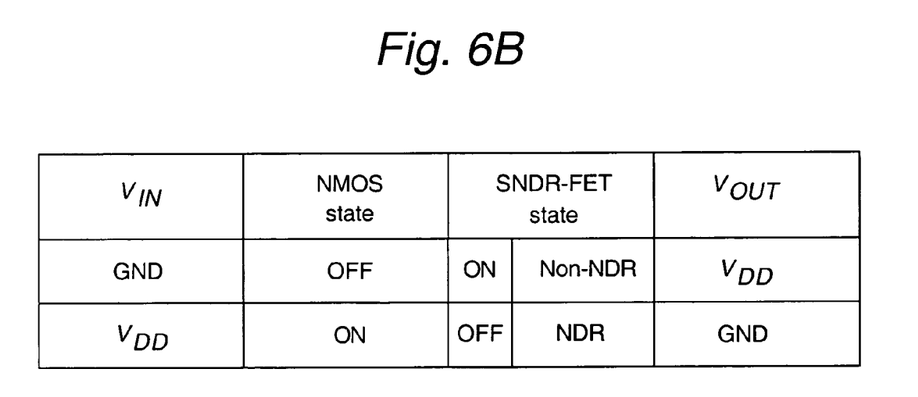
FIG. 6B is a logic table describing the operation of the embodiment of FIG. 6A.
Figure 7:
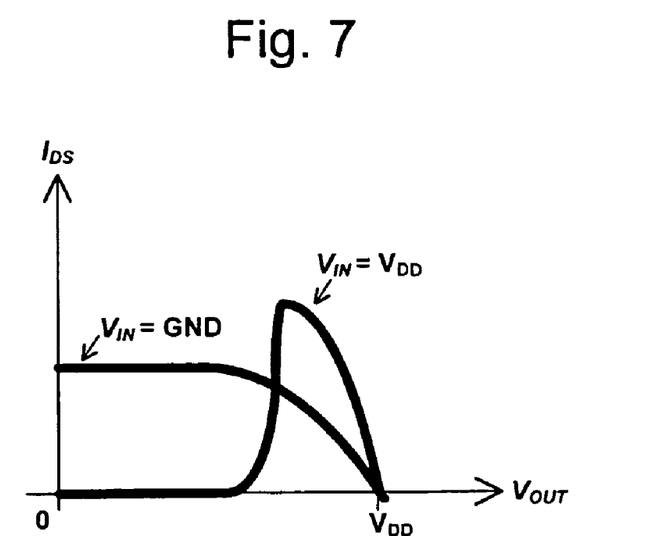
FIG. 7 is a graphical chart illustrating the current versus voltage (I-V) characteristics of a switchable NDR-MISFET as used in the circuit of FIG. 6A.

The basic operation of inverter 600 is illustrated in FIG. 6B. Again, low static power dissipation and large static noise margin are provided. Unlike prior art pure n-channel inverters, the output of the present inverter can be made symmetric, since either the pull-down device 610 or the pull-up device 620 is off in a static mode. This again is an advantage over existing all n-channel architectures.

Since NMOSFET 610 is shut off, there is no specific requirement for the ON resistance (hence IDS) of SNDR-FET 620 in the non-NDR state to guarantee that $V_{OUT}$ will rise above $V_{DD}/2$ and reach $V_{DD}$. This means that the inverter 600 output can achieve high speed, full rail-to-rail values (i.e., 0 to $V_{DD}$) with all n-channel active devices, and with a reduced DC power consumption on a par with equivalent CMOS counterparts.

In the example given for a replacement for a CMOS inverter circuit it is concluded that an NDR threshold voltage for the gate ($V_{GNDR}$) preferably should be between 0 and $V_{DD}/2$. Ideally, $V_{GNDR}=V_{DD}/2$ to achieve the shortest possible signal propagation delay from $V_{IN}$ to $V_{OUT}$. In order to guarantee proper circuit operation, $V_{GNDR}$ should be greater than 0 Volts and not larger than $V_{DD}/2$. Again, for specific circuit implementations, it is expected that these values will vary, and the invention is not limited in this respect.

It can be seen, therefore, that SNDR FET 620 includes two channel shut-off mechanisms that operate using different phenomena. These two phenomena can be tapped into using different biasing techniques, so that a single device can behave with two different behaviors at two different times, achieving two different degrees of freedom. In the first case, a conventional shut-off mechanism turns off the device based on a conventional depletion mode biasing scheme. In this scheme, a low drain-to-source voltage is used to shut off the device. In the second case, an NDR shut-off mechanism is exploited, in which a high gate voltage is used to shut off the device.

In other all n-channel prior art solutions, the gate is "tied" to a fixed potential—and thus the pull-down FET is always on—creating an undesirable result. In other words, the channel conductivity of the n-channel pull-up element does not change in response to an input signal. In the present case, a pull-up element implemented as SNDR FET 620 can "switch" based on an input signal, and thus effectively imitate the behavior of a p-channel device. The latter also switches the conductivity of a channel in response to the state of an input signal, resulting in an extremely low power mode of operation. The reason why SNDR FET 620 can effectively mimic a p-channel device is because an input signal (i.e., the gate control signal) which would ordinarily turn the device on can itself be trumped (so to speak) by a source/drain voltage that exceeds an NDR threshold, turning the device off. So in the one instance a non-NDR mode is employed for device 620 when the input is low, and an NDR mode is used when the input is high. Thus, the present invention exploits an NDR characteristic of SNDR FET 620 in combination with various inherent features of inverter 600.

In summary, the n-channel depletion mode SNDR-FET 620 has the required characteristics (it turns OFF when the gate bias is high, and ON when the gate bias is low) in order to replace the PMOSFET as a pull-up device in any complementary integrated circuit. As such, it provides the benefits of a CMOS technology (lower standby power larger and large static noise margin), eliminates significant technological challenges for transistor scaling, and may provide substantial improvements in transistor layout density as well.

Because the present device is also compatible with MOS operations, it can be formed with structural features (and processing operations) also commonly used by a non-NDR IGFET 610. For example, a gate insulation layer, source/drain regions, isolation regions, contacts, gate electrodes, etc., formed in a semiconductor substrate/wafer can all be formed at the same time during common operations and thus shared with an SNDR FET 620 of the present invention. Furthermore, some regions can be shared to increase integration density, such as a drain region for NMOSFET 610 and a source region for SNDR FET 620. From a process integration perspective, the present approach provides a substantial advantage, therefore, over mixed process technologies.

Again, while an example of an inverter is provided to illustrate the nature of the present invention, it is by no means limited to such types of logic gates. For example, the pull-up element described herein could be used in, among other applications, an output buffer circuit, a Boolean logic gate (AND, OR, XOR, XNOR, NOR, NAND) and larger circuits.

When used in different types of logic gates, collections of different types of gates, or memory cells, the necessary biasings required to achieve a similar operation will be apparent to those skilled in the art using routine skill.

It should be noted that NDR-FETs can be used in conjunction with NMOSFETs to implement various circuit functions much more efficiently (i.e. with far fewer transistors) than a conventional CMOS technology. This is ultimately the most beneficial approach for future VLSI technology. NDR-based circuit designs promise not only to lower the cost per function, but also to lower power consumption.

While this invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

The invention claimed is:

1. In a logic gate including at least one first dopant type channel insulated gate field effect transistor (IGFET), the first dopant type channel IGFET having an IGEET gate terminal coupled to an input node, a first IGFET source/drain terminal connected to a first potential, and a second IGFET source/drain terminal coupled to an output node, the improvement comprising:

a negative differential resistance field-effect ransistor (NDR-FET) element that also has a first dopant-type channel, said NDR FET element including a first NDR FET source/drain terminal connected to a second potential, a second NDR source/drain terminal connected to the output node, and an NDR gate terminal connected to the input node;

wherein the NDR FET element operates as a pull-up device for the logic gate, so that the logic gate is formed entirely of active devices having a common channel dopant type.

2. The logic gate of claim 1, wherein said NDR FET element is a depletion mode device.

3. The logic gate of claim 1, wherein the output node is a source/drain region shared by said NDR FET and the IGFET.

4. The logic gate of claim 1, wherein said first type dopant is n-type so that said NDR FET and the IGFET are n-channel devices.

5. The logic gate of claim 1, wherein the logic gate implements a Boolean logic function (AND, OR, NOT, NAND, NOR, XOR, XNOR).

6. A semiconductor circuit comprising:
a first n-channel field effect transistor pull-up element having a gate coupled to an input signal associated with the semiconductor logic gate;
a second n-channel FET pull-down element connected in series with said first-channel device and also having a gate directly coupled to said input signal;
wherein said first n-channel device is placed in an ON state and said second n-channel device is placed in an OFF state in response to said input signal having a first logic level value;
further wherein said first n-channel device is placed in an OFF state and said second n-channel device is placed in an ON state in response to said input signal having a second logic level value;
wherein said semiconductor circuit is implemented entirely with n-channel devices.

7. The semiconductor circuit of claim 6, wherein said first n-channel field effect transistor and said second n-channel field effect transistor share a common diffusion region, a common gate insulator, and a common gate electrode.

8. The semiconductor circuit of claim 6, wherein the semiconductor circuit dissipates substantially zero DC power during static operation.

9. The semiconductor circuit of claim 6, wherein an integrated circuit die containing the semiconductor circuit includes only n-channel devices.

10. The semiconductor circuit of claim 9, wherein a silicon wafer containing said integrated circuit die is manufactured with a MOS process to have only n-channel devices.

11. A method of operating an n-channel silicon based semiconductor transistor comprising the steps of:
applying a low bias signal to a gate of the n-channel silicon based semiconductor transistor and a first source-drain bias to place the n-channel silicon based semiconductor transistor in an ON state;
applying a high bias signal to said gate of the n-channel silicon based semiconductor transistor and a second source-drain bias, different from said first source-drain bias, to place the n-channel silicon based semiconductor transistor in an OFF state;
wherein the n-channel silicon based semiconductor transistor is adapted to respond to a gate bias signal substantially like a p-channel FET.

12. The method of claim 11, wherein the n-channel silicon based semiconductor is used as a pull-up device.

13. The method of claim 12, wherein the n-channel silicon based transistor is used in a logic gate.

14. A method of operating a negative differential resistance (NDR) field effect transistor (FET) device comprising the steps of:

applying a low bias signal to a gate of the NDR FET and a first source-drain bias to place the NDR FET in an ON state;
applying a high bias signal to said gate of the NDR FET and a second source-drain bias, different from said first source-drain bias, to place the NDR FET in an OFF state;
wherein the NDR FET switches substantially like a p-channel FET.

15. The method of claim 14, wherein the NDR FET is a depletion mode n-channel device.

16. The method of claim 14, wherein the NDR FET has an OFF switching time in an NDR mode of operation that is approximately equal to an OFF switching time in a non-NDR mode of operation.

17. The method of claim 14, wherein the NDR FET dissipates substantially zero DC power during a static mode of operation in said OFF state.

18. The method of claim 14, wherein the NDR FET is used as a pull-up element.

19. A method of operating an n-channel semiconductor pull-up element for use in a silicon based semiconductor circuit comprising the steps of:
coupling a drain of the n-channel semiconductor pull-up element to a first voltage potential, and a source to an output node and a drain of an n-channel pull-down element;
coupling a gate of the n-channel semiconductor pull-up element to an input signal;
selectively switching a negative differential resistance (NDR) mode for the n-channel semiconductor pull-up element;
operating the n-channel semiconductor pull-up element in a depletion mode to switch on and off in a similar manner to that which a p-channel FET would respond to an input bias signal, such that:
in response to a low gate input bias signal the n-channel semiconductor pull-up element turns on;
in response to a high gate input bias signal, and a high source-drain potential the n-channel semiconductor pull-up element turns off;
wherein the n-channel semiconductor pull-up element imitates a switching behavior of an active p-channel device to reduce power consumption in the silicon based semiconductor circuit.

20. A method of operating a semiconductor circuit including a first n-channel field effect transistor (FEY) configured as a pull-up element, the method comprising the steps of:
(a) applying an input signal having at least a low logic level or a high logic level to the semiconductor circuit;
(b) applying said input signal to a gate of the first n-channel FET and at least one other second n-channel FET;
(c) coupling the first n-channel FET and the second channel FET to an output node;
(d) causing at least said first n-channel FET to imitate a switching behavior of a p-channel FET, such that:
in response to said input signal being said low logic level, the first n-channel FET turns on;
in response to said input signal being said high logic level, the first n-channel FET turns off;
wherein an output signal is generated from said input signal using only n-channel type active devices in the semiconductor circuit;
further wherein a DC power consumption of the semiconductor circuit is substantially zero during static operating modes.

21. The method of claim 20, wherein the semiconductor circuit is a logic gate.

22. The method of claim 20, wherein the first n-channel FET is a switchable negative differential resistance device.

23. A method of operating a semiconductor circuit comprising the steps of:
configuring an n-channel negative differential resistance (NDR) field effect transistor as a pull-up element in the semiconductor circuit that is coupled to an input and an output for the semiconductor circuit;
configuring an n-channel metal-insulator-semiconductor MIS FET as a pull-down element coupled to the pull-up element in the semiconductor circuit;
wherein during a first mode of operation said n-channel NDR FET operates with an NDR characteristic in response to an input signal exceeding a first voltage value;
said n-channel NDR FET being further adapted to suppress said negative differential resistance effect during a second mode of operation in response said input signal not exceeding said first voltage value;
further wherein during said first mode of operation the n-channel NDR FET can be switched off in response to a drain voltage potential exceeding an NDR onset value ($V_{NDR}$)
further wherein during said second mode of operation the semiconductor device is switched on in response to said input signal attaining a logical low level.

24. The method of claim 23, wherein the n-channel NDR FET imitates a switching behavior of a p-channel FET.

25. The method of claim 23, wherein said drain voltage potential exceeds said NDR onset value ($V_{NDR}$); when a source of the n-channel NDR FET is pulled low by the n-channel MISFET in response to said input signal reaching a logical high level.

26. The method of claim 23, wherein the semiconductor circuit operates as an inverter.

27. A method of making a semiconductor circuit comprising the steps of:
forming a first n-channel field effect transistor (FET) pull-up element having a first gate for receiving an input signal associated with the semiconductor circuit, the first n-channel FET pull-up element comprising a depletion-mode switchable negative differential resistance (SNDR) FET;
forming a second n-channel FET pull-down element connected in series with the first n-channel FET pull-up element, the second n-channel FET pull-down element having a second gate for receiving said input signal;
wherein a first ON resistance of the first n-channel pull-up element is less than a second ON resistance of the second n-channel FET pull-down element.

28. In an n-channel transistor for use in a semiconductor circuit including a gate, a source region, a drain region, and a channel coupling the source region and the drain region, the improvement comprising:
the n-channel transistor being configured so that in response to a first value of a gate bias signal the n-channel transistor can be switched on and off based on the gate bias signal controlling a channel conductivity; and
the n-channel transistor being further configured so that in response to a second value of the gate bias signal the n-channel transistor can be switched on and off in response to a source/drain bias signal controlling the channel conductivity,
wherein the n-channel transistor is an n-channel depletion mode device that switches substantially like a p-channel device in response to the gate bias signal in the semiconductor circuit, and
wherein the n-channel transistor has a channel length that is slightly larger than a channel length of other n-channel devices in the semiconductor circuit that do not operate like a p-channel device.

29. A logic gate comprising:
a first n-channel device coupled to an input signal and an output node; and
a second n-channel device connected in series with the first-channel device,
wherein the first n-channel device imitates a switching behavior of a p-channel field effect transistor in response to a value of the input signal, and
wherein an inverter function (NOT) is effectuated by the logic gate.

30. A logic gate comprising:
a first n-channel device coupled to an input signal and an output node; and
a second n-channel device connected in series with said first-channel device,
wherein the first n-channel device imitates a switching behavior of a p-channel field effect transistor in response to a value of the input signal, and
wherein a first resistance of the first n-channel device is larger than a second resistance of the second n-channel device.

* * * * *